United States Patent
Poulin et al.

(10) Patent No.: US 11,290,072 B2
(45) Date of Patent: Mar. 29, 2022

(54) MULTI-MODE POWER AMPLIFIER

(71) Applicant: SKYWORKS SOLUTIONS, INC., Irvine, CA (US)

(72) Inventors: Grant Darcy Poulin, Carp (CA); Apostolos Samelis, Bishop's Stortford (GB); Alasdair Bruce, Sawbridgeworth (GB); Neal J. Tuffy, Great Shelford (GB); Michael John Ball, Newmarket (GB)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 27 days.

(21) Appl. No.: 17/005,890

(22) Filed: Aug. 28, 2020

(65) Prior Publication Data
US 2021/0067110 A1 Mar. 4, 2021

Related U.S. Application Data

(60) Provisional application No. 63/051,946, filed on Jul. 15, 2020, provisional application No. 62/893,378, filed on Aug. 29, 2019.

(51) Int. Cl.
*H03F 1/30* (2006.01)
*H03F 3/24* (2006.01)
*H03F 3/195* (2006.01)

(52) U.S. Cl.
CPC ............ *H03F 3/245* (2013.01); *H03F 3/195* (2013.01); *H03F 2200/105* (2013.01); *H03F 2200/421* (2013.01); *H03F 2200/451* (2013.01); *H03F 2200/504* (2013.01)

(58) Field of Classification Search
CPC ........................................................ H03F 1/30
USPC ........................................ 330/297, 296, 285
See application file for complete search history.

(56) References Cited

U.S. PATENT DOCUMENTS

| 8,975,960 B2 * | 3/2015 | Strange | H03F 1/0222 330/136 |
| 2004/0267986 A1 * | 12/2004 | Leung | G06F 13/28 710/69 |
| 2014/0184335 A1 * | 7/2014 | Nobbe | H03F 3/45183 330/291 |
| 2015/0280652 A1 * | 10/2015 | Cohen | H03F 1/0227 330/297 |

* cited by examiner

*Primary Examiner* — Henry Choe
(74) *Attorney, Agent, or Firm* — Lando & Anastasi, LLP

(57) ABSTRACT

A power amplifier module that includes a power amplifier having a plurality of amplifier gain stages, a memory device including a plurality of memory locations, and a controller to receive a control signal having at least one of a first state and a second state. The plurality of memory locations includes at least one first memory location to store a first set of configuration parameters for operation in a first mode, and at least one second memory location to store a second set of configuration parameters for operation in a second mode. The controller configures the power amplifier module in the first mode based on the first set of configuration parameters responsive to receiving the control signal having the first state and configures the power amplifier module in the second mode based on the second set of configuration parameters responsive to receiving the control signal having the second state.

14 Claims, 6 Drawing Sheets

MULTI-MODE POWER AMPLIFIER

CROSS-REFERENCE TO RELATED APPLICATIONS

This application claims priority under 35 U.S.C. § 119(e) to U.S. Provisional Patent Application Ser. No. 62/893,378, titled MULTI-MODE POWER AMPLIFIER, filed Aug. 29, 2019, and to U.S. Provisional Patent Application Ser. No. 63/051,946, titled MULTI-MODE POWER AMPLIFIER, filed Jul. 15, 2020, each of which is incorporated herein by reference for all purposes.

BACKGROUND

Modern wireless electronic devices are often required to support multiple types of signals and communication standards (e.g., Bluetooth, WiFi, etc.). As a result, the components of such wireless devices must be capable of meeting various performance requirements corresponding to each signal type being supported. In some cases, this requires dedicated components, such as amplifiers, for each signal type. The inclusion of these dedicated components, as well as other additional components, can increase cost, degrade performance, and increase the footprints of both the components and the wireless devices themselves.

SUMMARY

Aspects and examples are directed to amplifier systems and components thereof, and to devices, modules, and systems incorporating same. Multi-mode power amplifier systems and methods disclosed herein can accommodate multiple signal types by operating in multiple modes or states to meet the performance requirements of each signal type.

According to an aspect of the present invention, a power amplifier module is provided. The power amplifier module comprises a power amplifier including a plurality of amplifier gain stages, the plurality of amplifier gain stages including an input amplifier gain stage having an input configured to receive an input radio frequency signal and an output amplifier gain stage having an output configured to provide an output radio frequency signal; a memory device including a plurality of memory locations, the plurality of memory locations including at least one first memory location to store a first set of configuration parameters for operation of the power amplifier module in a first mode of operation, and at least one second memory location to store a second set of configuration parameters for operation of the power amplifier module in a second mode of operation, the second set of configuration parameters being different, at least in part, from the first set of configuration parameters; and a controller to receive a control signal having at least one of a first state and a second state. The controller configures the power amplifier module for operation in the first mode of operation based on the first set of configuration parameters responsive to receiving the control signal having the first state and configures the power amplifier module for operation in the second mode of operation based on the second set of configuration parameters responsive to receiving the control signal having the second state.

In some embodiments the first set of configuration parameters includes a first set of bias levels for the plurality of amplifier gain stages and the second set of configuration parameters includes a second set of bias levels for the plurality of amplifier gain stages, the second set of bias levels being different, at least in part, from the first set of bias levels. In further embodiments, the controller is further configured to control a bias level of each respective amplifier gain stage of the plurality of amplifier gain stages based on the first set of bias levels in the first mode of operation and to control the bias level of each respective amplifier gain stage of the plurality of amplifier gain stages based on the second set of bias levels in the second mode of operation.

In some embodiments the power amplifier further includes an attenuator coupled between an input of the power amplifier and the input of the input amplifier gain stage, and a bypass path coupled in parallel with the attenuator. In some embodiments the first set of configuration parameters includes a first bypass switch state and the second set of configuration parameters includes a second bypass switch state, the second bypass switch state being different than the first bypass switch state. In at least one embodiment, the controller is further configured to open the bypass switch based on the first bypass switch state in the first mode of operation and to close the bypass switch based on the second bypass switch state in the second mode of operation.

In some embodiments the power amplifier further includes an output detector coupled between the input amplifier gain stage and the output amplifier gain stage, the output detector configured to provide a linear output voltage to the controller indicating a power level of the output radio frequency signal.

In some embodiments the first set of configuration parameters includes a first output power level and the second set of configuration parameters includes a second output power level, the second output power level being different than the first output power level. In further embodiments the controller is further configured to tune the power level of the output radio frequency signal based on the linear output voltage and the first output power level in the first mode of operation and based on the linear output voltage and the second output power level in the second mode of operation. In some embodiments the controller is configured to tune the power level of the output radio frequency signal by adjusting the bias level of at least one amplifier gain stage of the plurality of amplifier gain stages.

In some embodiments the first set of configuration parameters includes a first set of output detector settings and the second set of configuration parameters includes a second set of output detector settings, the second set of output detector settings being different, at least in part, from the first set of output detector settings.

In at least one embodiment the controller is further configured to adjust the output detector to support a first signal bandwidth based on the first output detector settings in the first mode of operation and to adjust the output detector to support a second signal bandwidth based on the second set of output detector settings in the second mode of operation, the second signal bandwidth being different from the first signal bandwidth. In other embodiments the controller is further configured to adjust the output detector to support a first output power slope of the power amplifier based on the first output detector settings in the first mode of operation and to adjust the output detector to support a second output power slope of the power amplifier based on the second set of output detector settings in the second mode of operation, the second output power slope being different than the first output power slope. In still further embodiments the controller is further configured to control the output detector to use a first offset value based on the first set of output detector settings in the first mode of operation and to control the output detector to use a second offset value based on the second set of output detector settings in the second mode of operation, the first offset value corresponding to a first absolute voltage level for the output radio frequency signal and the second offset value corresponding to a second absolute voltage level for the output radio frequency signal, the second offset value being different than the first offset value.

According to another aspect, a method of operating a power amplifier module having at least two modes of operation is provided. The method comprises receiving a radio-frequency (RF) input signal at an input of the power amplifier module, receiving a control signal indicating a desired mode of operation of the at least two modes of operation, selecting a set of configuration parameters corresponding to the desired mode of operation from two or more sets of stored configuration parameters, configuring the power amplifier module based on the selected set of configuration parameters, and amplifying the RF input signal to provide an amplified RF signal to an output of the power amplifier module.

According to at least one embodiment configuring the power amplifier module includes controlling a plurality of bias levels corresponding to a plurality of gain stages of a power amplifier based on the selected set of configuration parameters. In a further embodiment configuring the power amplifier module further includes controlling an attenuation bypass switch based on the selected configuration parameters to selectively attenuate the RF input signal.

In at least one embodiment the method further comprises detecting a linear output voltage provided by an output detector of the power amplifier and tuning an output power level of the amplified RF signal based on the linear output voltage and the selected set of configuration parameters. In accordance with at least one embodiment tuning the output power level of the amplified RF signal includes adjusting at least one of the plurality of bias levels corresponding to at least one of the plurality of gain stages of the power amplifier.

In accordance with at least one embodiment configuring the power amplifier module further includes adjusting the output detector based on the selected set of configuration parameters to support at least one of a signal bandwidth corresponding to the desired mode of operation, an output power slope for the amplified RF signal corresponding to the desired mode of operation, and an absolute voltage level for the amplified RF signal corresponding to the desired mode of operation.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and examples are directed to amplifier systems and components thereof, and to devices, modules, and systems incorporating same.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
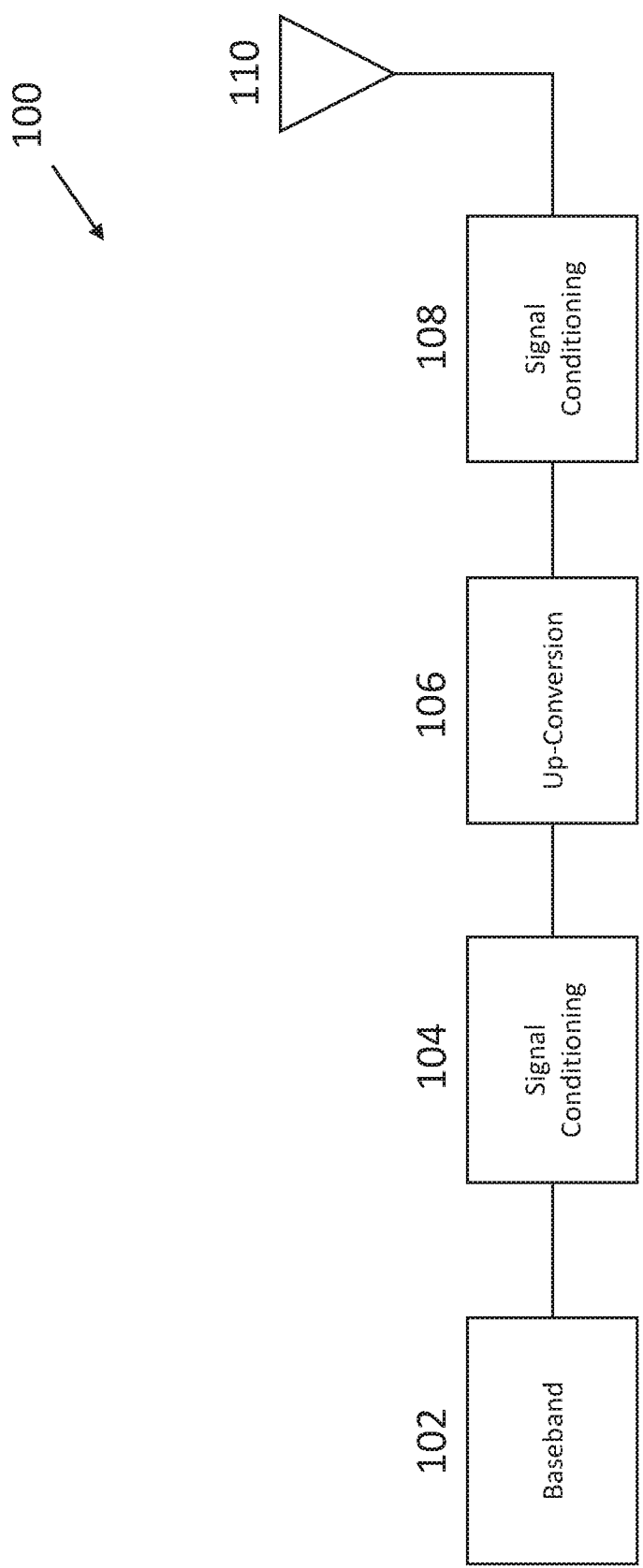
FIG. 1 is a block diagram of an example wireless transmission chain.

FIG. 1 is a block diagram of an example of a wireless transmit (TX) chain 100. The wireless TX chain 100 may be included, for example, in a wireless device such as a cellular phone or a laptop computer. The TX chain 100 includes a baseband processor 102 configured to provide transmit baseband signals that are conditioned and upconverted to a desired transmit frequency. The TX chain may include a signal conditioning stage 104 before the up-conversion stage 106 and a signal conditioning stage 108 after the up-conversion stage; however, in some examples the TX chain may only include one signal conditioning stage (i.e., 104 or 108). In some examples, the wireless TX chain 100 may include more than one up-conversion stage. After conditioning and up-conversion, the transmit signals are transmitted via an antenna 110.

The signal conditioning stages 104 and 108 may include devices and methods for manipulating an input signal, such as attenuating, filtering, and amplifying the input signal. In some examples, the signal conditioning stages 104 and 108 may be configured to manipulate the input signal in different ways depending on a specific transmit mode or type of transmit signal. In many cases, different types of signals and standards (e.g., Bluetooth, WiFi, etc.) have different requirements for parameters such as output power, linearity, gain, etc., and require specific conditioning. For example, a signal conditioning stage may be required to condition a first type of signal, e.g., a Bluetooth signal, differently than a second type of signal, e.g., a Wi-Fi signal.

Figure 2:
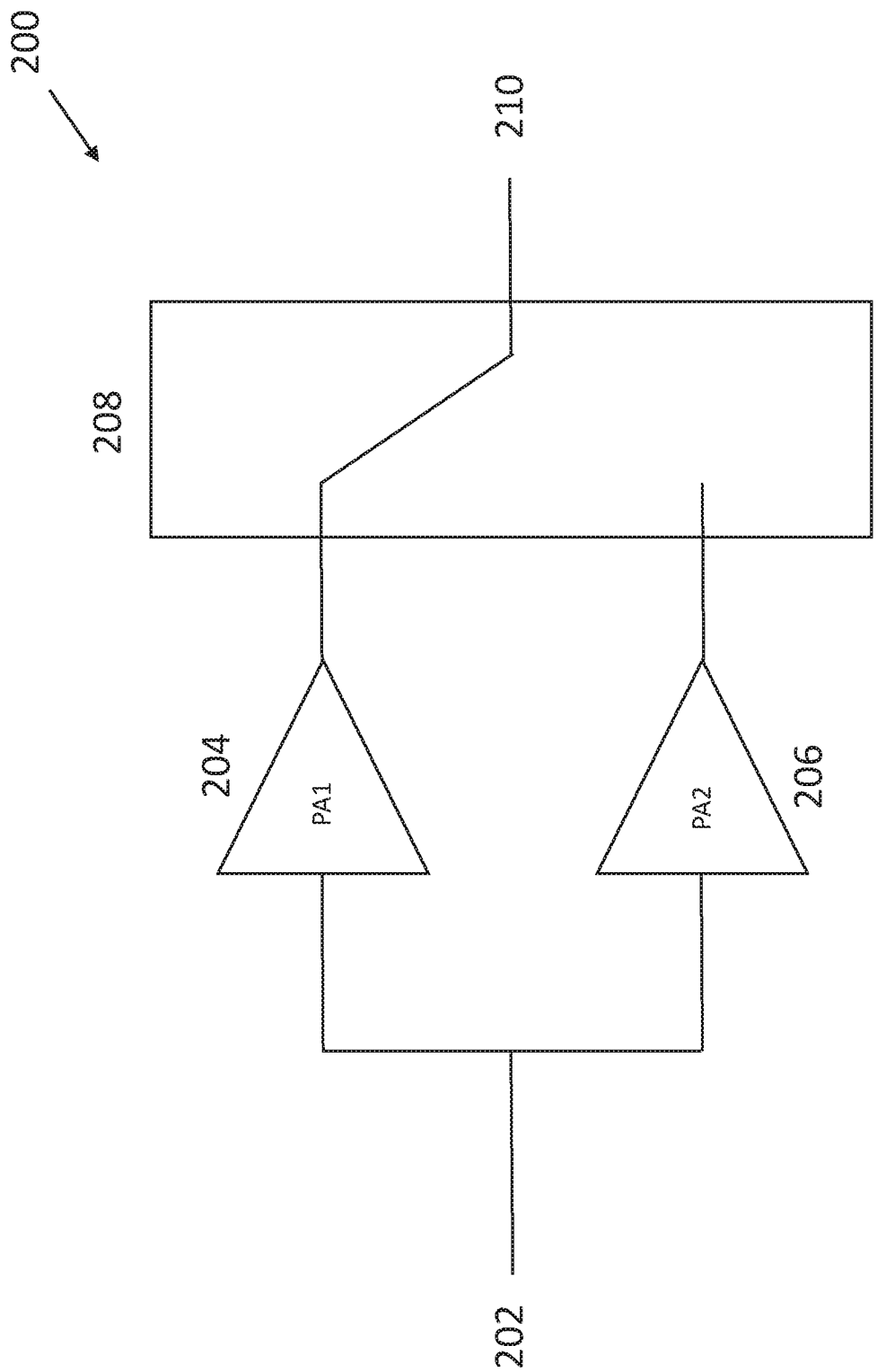
FIG. 2 is a schematic diagram of an example power amplifier arrangement for wireless transmission.

Signal conditioning stages, such as those discussed above, often include power amplifiers to provide amplification of the transmit signal to meet the performance requirements of various wireless standards. FIG. 2 is a schematic diagram of an example of a power amplifier arrangement 200. The power amplifier arrangement 200 may be included, for example, in either of the signal conditioning stages 104 and 108 shown in FIG. 1. The power amplifier arrangement 200 includes a first power amplifier 204, a second power amplifier 206, and a switch 208. In one example, the input of the first power amplifier 204 and the input of the second power amplifier 206 are both coupled to a signal input 202 that receives a radio-frequency (RF) signal. During a first mode of operation, the switch 208 may be controlled to selectively couple the output of the first power amplifier 204 to a signal output 210. Likewise, in a second mode of operation, the switch 208 may be controlled to selectively couple the output of the second power amplifier 206 to the signal output 210.

By selectively coupling each power amplifier to the signal output 210 during different modes of operation, the power amplifier arrangement 200 can support at least two different signal types. In one example, the power amplifier arrangement 200 may be configured to provide amplification for a first signal type, e.g., Bluetooth, during the first mode of operation and provide amplification for a second signal type, e.g., WiFi, during the second mode of operation. In some examples, the first power amplifier 204 may be configured to operate differently than the second power amplifier 206 to meet different signal requirements. For example, the first power amplifier 204 and the second power amplifier 206 may be biased at different bias levels to provide different amounts of output power. In one example, the first power amplifier 204 and the second power amplifier 206 may be selected to have different performance characteristics in accordance with the performance requirements of the signal types being supported.

The multiple amplification path approach of the power amplifier arrangement 200 allows for support of two signal types; however, such implementations require additional components (e.g., amplifiers, switches, etc.). The inclusion of these additional components can increase cost and degrade performance (e.g., insertion loss, heat generation, etc.). In addition to cost and performance concerns, these additional components also increase the size of power amplifier footprints, occupying valuable space within wireless devices.

Systems and methods directed to a multi-mode power amplifier that accommodates two or more signal types are provided herein. In at least one embodiment, the multi-mode power amplifier may accommodate two or more signal types by operating in two or more modes to meet various performance requirements of each signal type. More specifically, the configuration of the multi-mode power amplifier is optimized for a specific signal type during each mode of operation.

Figure 3:
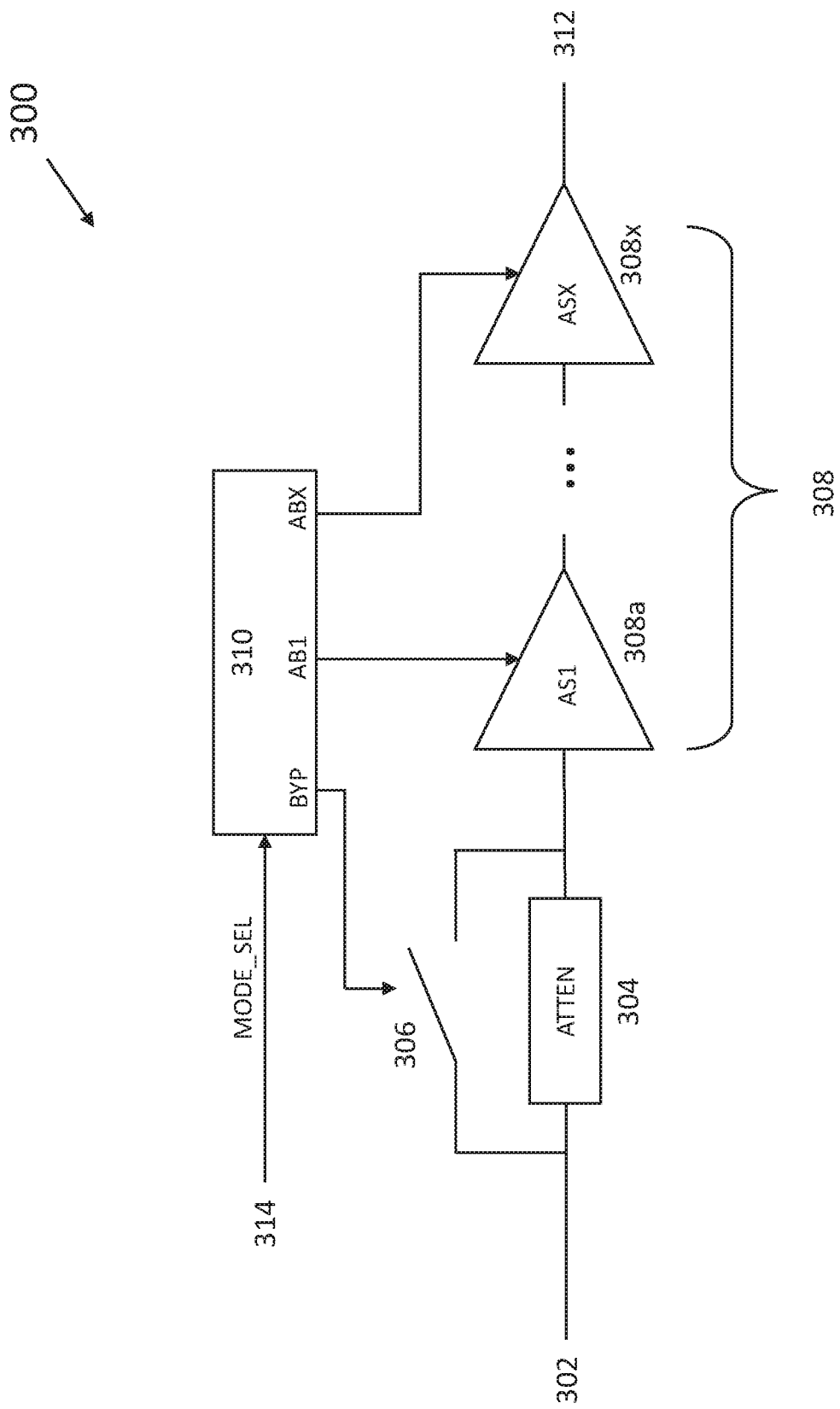
FIG. 3 is a schematic diagram of a multi-mode power amplifier system in accordance with one embodiment.

FIG. 3 illustrates one embodiment of a multi-mode power amplifier 300 in accordance with aspects described herein. The power amplifier 300 may be included, for example, in either of the signal conditioning stages 104 and 108 shown in FIG. 1. As illustrated in FIG. 3, the power amplifier 300 includes a signal input 302 to receive an input signal. The signal input 302 is coupled to an attenuator 304 that further couples to a plurality of amplifier gain stages 308. The plurality of amplifier gain stages 308 includes a first stage 308a, a second stage 308b, etc. In some examples, the plurality of amplifier gain stages 308 may be series-coupled; i.e., the first output of the first stage 308a is coupled to the input of the second stage 308b, and so on. The output of the plurality of amplifier gain stages 308 (e.g., the output of the last stage 308x) is coupled to a signal output 312 of the power amplifier 300 to provide an amplified output signal. In various embodiments, additional components may be included, such as a bypass switch 306 to selectively bypass the attenuator 304.

In certain embodiments, a controller 310 is included in the power amplifier 300. In one example, the controller 310 is a programmable digital controller. In some examples, the controller 310 may include one or more memory devices, such as flash, embedded or on-chip memory, or other devices for storing data. In one embodiment, the controller 310 is coupled to the bypass switch 306 and each respective stage of the plurality of amplifier gain stages 308. In some embodiments, the controller 308 may also be coupled to the attenuator 304.

In one example, the controller 310 includes a plurality of memory locations to support different modes of operation of the power amplifier 300. Each mode of operation may correspond to a signal type supported by the power amplifier 300 (e.g., Bluetooth, WiFi, etc.). In one example, each memory location, or a portion of memory locations, of the plurality of memory locations may be assigned to a specific mode of operation. For example, a first memory location may be assigned to a first mode of operation, i.e., Bluetooth, and a second memory location may be assigned to a second mode of operation, i.e., WiFi. Each memory location may contain configuration parameters or settings corresponding to operation of the attenuator 304, the bypass switch 306, and each respective stage of the plurality of amplifier gain stages 308. For example, the first memory location may contain a first set of configuration parameters corresponding to the first mode of operation, i.e., Bluetooth, and the second memory location may contain a second set of configuration parameters corresponding to the second mode of operation, i.e., WiFi.

In one example, the controller 310 may receive a mode select signal 314 indicating a desired mode of operation of the power amplifier 300. The controller 310 may select a memory location from the plurality of memory locations based on the mode select signal 314, and control or operate the attenuator 304, the bypass switch 306, and each of the plurality of amplifier gain stages 308 using the configuration parameters stored in the selected memory location.

The controller 310 may control operation of the plurality of amplifier gain stages 308 by controlling the bias level of each respective amplifier gain stage. Each respective amplifier gain stage can be biased independently of the other stages and may be switched between multiple bias levels. For example, each stage of the plurality of amplifier gain stages 308 may be operated over a range of bias levels from, for example, 0 to 31, thus providing numerous bias combinations across the plurality of amplifier gain stages 308.

The bias level for each respective amplifier gain stage may be selected based on performance requirements of the desired (or active) mode of operation of the power amplifier 300. Each set of configuration parameters stored in the plurality of memory locations of the controller 310 may contain mode specific bias levels for each respective amplifier gain stage. For example, the configuration parameters stored in the first memory location assigned to the first mode of operation, i.e., Bluetooth, may contain a first bias level, e.g., 17, for the first stage 308a, a second bias level, e.g., 19, for the second stage 308b, a third bias level, e.g., 23, for the third stage 308c, and so on. Likewise, the second memory location assigned to the second mode of operation, i.e., WiFi, may contain different bias levels for each respective amplifier gain stage of the plurality of amplifier gain stages 308.

In some examples, to control the bias level of each respective amplifier gain stage, the controller 310 may adjust a bias supply configured to provide a bias current to each respective stage. The controller 310 may adjust the bias supply such that the bias currents provided to each respective amplifier gain stage correspond to the bias levels selected for the specific mode of operation of the power amplifier 300. In some examples, each respective amplifier gain stage may have a dedicated bias supply and the controller 310 may adjust each dedicated bias supply such that each respective amplifier gain stage is biased to the appropriate bias level. In other examples, the controller 310 may include a current digital to analog converter (IDAC). The IDAC of the controller 310 may provide a reference current for each respective amplifier gain stage corresponding to the selected bias level for each respective amplifier gain stage. In some examples, the reference currents may be provided to each respective amplifier gain stage for biasing; however, in other examples the reference currents may be provided to one or more current mirrors, and the mirrored currents may be provided to each respective amplifier gain stage for biasing.

In addition to the plurality of amplifier gain stages 308, the controller 310 may control operation of the attenuator 304 and/or the bypass switch 306 based on the mode of operation of the power amplifier 300. In one embodiment, the attenuator 304 is a fixed attenuator and the bypass switch 306 may be used to bypass the attenuator 304. For example, the bypass switch 306 may be turned on (i.e., closed) to couple the signal input 302 of the power amplifier 300 to the input of the first amplifier stage 308a. Likewise, the bypass switch 306 may be turned off (i.e., opened) to attenuate a signal received at the signal input 302 using the attenuator 304.

As discussed above, the controller 310 may include a plurality of memory locations to support multiple modes of operation of the power amplifier 300. In addition to bias levels for the plurality of amplifier stages 308, the configuration parameters stored in the plurality of memory locations may include settings for the attenuator 304 and/or the bias switch 306. For example, based on the mode select signal 314, the controller 310 may select the first memory location assigned to the first mode of operation, i.e., Bluetooth. Based on the configuration parameters stored in the first memory location, the bypass switch 306 may be turned off (i.e., opened) to attenuate the signal received at the signal input 302 before providing the signal to the plurality of amplifier stages 308. Alternatively, based on the mode select signal 314, the controller may select the second memory location assigned to the second mode of operation, i.e., WiFi. Based on the configuration parameters stored in the second memory location, the bypass switch 306 may be turned on (i.e., closed) to bypass the attenuator 304, such that the signal provided to the first amplifier gain stage 308a is substantially the same as the signal received at the signal input 302.

In some embodiments, the attenuator 304 may be an adjustable attenuator and the controller 310 may be configured to adjust the amount of attenuation provided by the attenuator 304. In some examples, the controller 310 may adjust the amount of attenuation provided by the attenuator 304 based on the mode of operation of the power amplifier 300. For example, the configuration parameters stored in each of the plurality of memory locations may include mode specific attenuation values for the attenuator 304.

The stored configuration parameters for each mode of operation of the power amplifier 300 may be pre-determined according to specific performance requirements for each signal type. In some examples, the configuration parameters for each mode of operation are selected to meet different performance requirements for output power, linearity, and gain of the power amplifier 300. In some examples, certain signal types may have additional performance requirements associated with communication standards and protocols. For example, for the first mode of operation, i.e., Bluetooth, the configuration parameters may be selected to optimize performance in reference to an adjacent channel power (ACP) specification. Likewise, for the second mode of operation, i.e., WiFi, the configuration parameters may be selected to optimize performance in reference to an out-of-band (OOB) specification.

In some embodiments, the configuration parameters for each mode of operation of the power amplifier 300 may be temperature dependent. The controller 310 may be configured to collect or receive a temperature associated with the power amplifier 300. For example, the controller 310 may collect or receive the temperature inside of the power amplifier 300, the temperature outside of the power amplifier 300, or the temperatures of individual power amplifier components (e.g., the plurality of amplifier gain stages 308, the attenuator 304, etc.).

In one example, the configuration parameters stored in the plurality of memory locations of controller 310 may correspond to a base temperature (e.g., a normal operating temperature). The controller 310 may adjust or calibrate the configuration parameters using a temperature coefficient of the power amplifier 300 and any of the collected/received temperatures discussed above. In some examples, the controller 310 may adjust or calibrate the configuration parameters using temperature coefficients corresponding to the individual power amplifier components. For example, the configuration parameters stored in the first memory location assigned to the first mode of operation, i.e., Bluetooth, may contain a base temperature bias level, e.g., 17, for the first amplifier gain stage 308a. After receiving an indication to operate the power amplifier 300 in the first mode of operation, the controller 310 may adjust the bias level to a different bias level, e.g., 16 or 18, based on the current temperature of the power amplifier 300, the plurality of amplifier gain stages 308, or the first amplifier gain stage 308a.

In addition to calibrating the configuration parameters before switching modes of operation, the controller 310 may adjust or calibrate the configuration parameters while operating in each mode of operation. In one example, the controller 310 may periodically receive or collect temperatures corresponding to the power amplifier 300, or individual components, and may update the configuration parameters accordingly. For example, in the first mode of operation, i.e., Bluetooth, the controller 310 may initially set the bias level of the first amplifier gain stage 308a to the base temperature bias level, e.g., 17. The controller 310 may then receive an updated temperature and adjust the bias level of the first amplifier gain stage 308a to a different bias level, e.g., 16 or 18, based on a change in temperature.

In some examples, each mode of operation may have more than one set of configuration parameters, and each of the memory locations assigned to a mode of operation may store a different set of configuration parameters. The controller 310 may be configured to select a set of configuration parameters for each mode of operation based on a variable condition (e.g., temperature). For example, the controller 310 may receive an indication to operate the power amplifier 300 in the first mode of operation, i.e., Bluetooth, from the mode select signal 314. If the temperature of the power amplifier 300 falls within a first temperature range, the controller 310 may select a first set of configuration parameters for the first mode of operation stored in a first memory location. Likewise, if the temperature of the power amplifier 300 falls within a second temperature range, the controller 310 may select a second set of configuration parameters for the first mode of operation stored in a second memory location.

In other examples, the controller 310 may be configured to select a set of configuration parameters for each mode of operation based on specific device applications or device types. For example, returning to FIG. 1, a first instance of the power amplifier 300 may be included in the signal conditioning stage 104 and a second instance of the power amplifier 300 may be included in the signal conditioning stage 108. In the first mode of operation, the first instance of the power amplifier 300 may be configured to apply a different amount of gain than the second instance of the power amplifier 300. The controller 310 of the first instance of the power amplifier 300 may be configured to select a first set of configuration parameters stored in a first memory location for the first mode of operation, and the controller 310 of the second instance of the power amplifier 300 may be configured to select a second set of configuration parameters stored in a second memory location for the first mode of operation.

Similarly, a first variation of the power amplifier 300 may be intended for use in a first device (e.g., a cellular phone) and a second variation of the power amplifier 300 may be intended for use in a second device (e.g., a mobile computer). In one example, for the first mode of operation, the controller 310 of the first variation of the power amplifier 300 may be configured to select a first set of configuration parameters stored in a first memory location. Likewise, for the first mode of operation, the controller 310 of the second variation of the power amplifier 300 may be configured to select a second set of configuration parameters stored in a second memory location.

Figure 4:
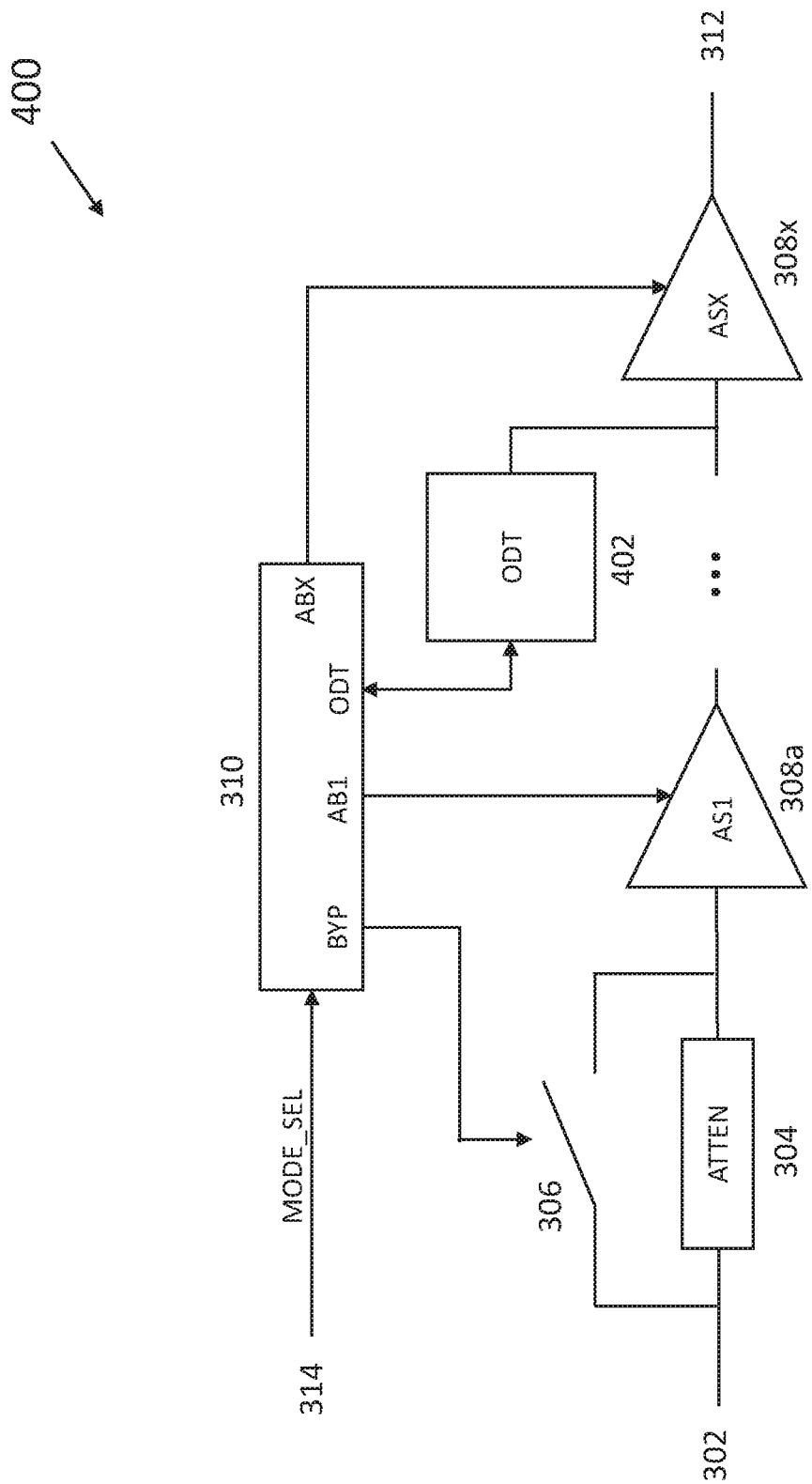
FIG. 4 is a schematic diagram of a multi-mode power amplifier system in accordance with one embodiment.

FIG. 4 illustrates one embodiment of a power amplifier 400 in accordance with aspects described herein. The power amplifier 400 is similar to the power amplifier 300 of FIG. 3, except the power amplifier 400 includes an output detector 402. In one example, the output detector 402 is configured to detect the output voltage level of the power amplifier 400 and provide the output voltage level to the controller 310. As shown in FIG. 4, the output detector 402 may be located before the last amplifier gain stage 308x; however, in other examples, the output detector 402 may be placed before or after any amplifier stage of the plurality of amplifier gain stages 308. Depending on placement, the output detector 402 may be configured to utilize direct or indirect detection methods.

In the example shown in FIG. 4, the output detector 402 is configured to detect a radio-frequency signal at the input of the last amplifier gain stage 308x. The output detector 402 may process the detected radio-frequency signal to produce a detector output voltage corresponding to the output power of the power amplifier 400. In some examples, the detector output voltage is provided to the controller 310, and the controller 310 may adjust the configuration parameters for individual components (e.g., the plurality of amplifier gain stages 308, the attenuator 304, etc.) to tune the performance of the power amplifier 400. For example, based on the detector output voltage, the controller 310 may adjust the bias level of one or more amplifier gain stages of the plurality of amplifier gain stages 308 to tune the output power level of the power amplifier 400.

Figure 5:
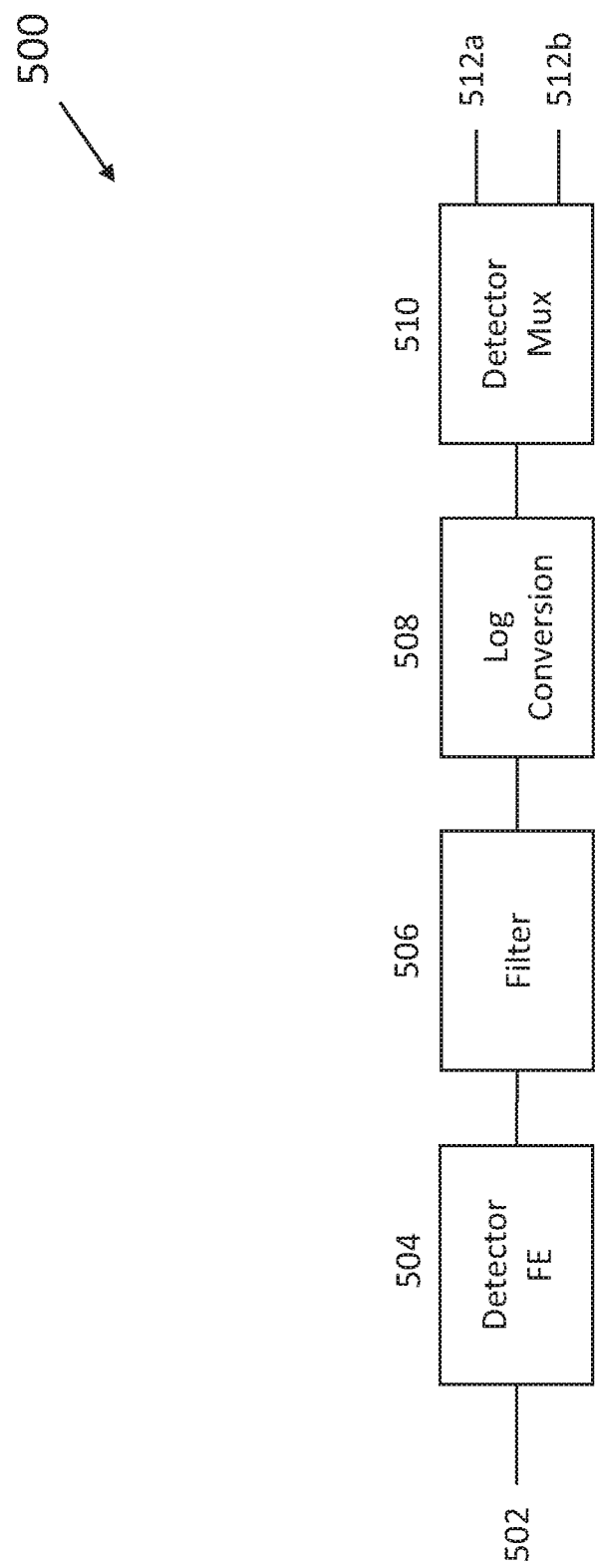
FIG. 5 is a block diagram of an output detector in accordance with one embodiment.

FIG. 5 illustrates one embodiment of an output detector 500 in accordance with aspects described herein. The output detector 500 may be used, for example, as the output detector 402 in the power amplifier 400 shown in FIG. 4. As illustrated in FIG. 5, the output detector 500 includes signal input 502 to receive an input signal; e.g., the radio-frequency signal at the input of the last amplifier gain stage 308x. In one example, the radio-frequency signal is sampled at the input of the last amplifier gain stage 308x using a signal coupler and provided to the signal input 502 of the output detector 500. A detector front-end stage 504 is configured to receive the input signal from the signal input 502 and to manipulate (e.g., rectify) the input signal for processing. In some examples, the detector front-end stage 504 may utilize a diode-based detection circuit, such as a half-wave rectifier.

In some embodiments, certain components or stages of the output detector 500 may be configured to operate differently based on the mode of operation of the power amplifier 400. For example, the output of the detector front-end stage 504 is provided to a filter stage 506 to produce a voltage level representing the magnitude of the input signal. The filter stage 506 may include an adjustable RC filter and the controller 310 may be configured to adjust the RC filter based on the mode of operation of the power amplifier 400. In one example, the RC filter may include a bank of capacitors and the controller 310 may control the capacitance of the RC filter by operating a plurality of switches to switchably couple and/or decouple capacitors based on the mode of operation. In another example, the filter stage 506 may include an RC filter bank and the controller 310 may be configured to switchably select an RC filter based on the mode of operation.

The configuration parameters stored in the plurality of memory locations of the controller 310 may include RC filter settings for each mode of operation. For example, the configuration parameters stored in the first memory location assigned to the first mode of operation, i.e., Bluetooth, may contain a first capacitance level for the RC filter, and the configuration settings stored in the second memory location assigned to the second mode of operation, i.e., WiFi, may contain a second capacitance level for the RC filter. In some embodiments, the RC filter settings for each mode of operation may be selected to optimize the RC filter in accordance with specific bandwidth requirements of each supported signal type (e.g., Bluetooth, WiFi, etc.). In one example, the RC filter settings for two or more modes of operation may be the same.

A log conversion stage 508 is configured to convert the output voltage of the filter stage 506 into a linear output voltage indicating the output power of the power amplifier 400. In some examples, the log conversion stage 508 may be configured to apply different offsets to control an absolute voltage level of the power amplifier 400. The configuration parameters stored in the plurality of memory locations of the controller 310 may include offset values for each mode of operation of the power amplifier 400. For example, the configuration parameters stored in the first memory location assigned to the first mode of operation, i.e., Bluetooth, may contain a first offset value corresponding to a first absolute voltage level. Likewise, the second configuration parameters stored in the second memory location assigned to the second mode of operation, i.e., WiFi, may contain a second offset value corresponding to a second absolute voltage level. In one example, the first and second offset values may be the same.

In some examples, the log conversion stage 508 may be configured to adjust the linear output voltage to control an output power slope of the amplifier assembly 400. The configuration parameters stored in the plurality of memory locations of controller 310 may include power slope settings for each mode of operation of the power amplifier 400. For example, the configuration parameters stored in the first memory location assigned to the first mode of operation, i.e., Bluetooth, may contain a first setting corresponding to a first output power slope. Likewise, the second configuration parameters stored in the second memory location assigned to the second mode of operation, i.e., WiFi, may contain a second setting corresponding to a second output power slope. In one example, the first and second settings may correspond to first and second slope control circuitry within the output detector 500, and the controller 310 may be configured to switchably select between the first and second slope control circuitry based on the mode of operation.

In some examples, an input buffer may be placed before the log conversion stage 508 and an output buffer may be placed after the log conversion stage 508. The input and output buffers may be included to provide impedance control, isolation, and/or signal conditioning as needed.

In one embodiment, the linear output voltage (i.e., the output of the log conversion stage 508) is provided to a multiplexer stage 510. The multiplexer stage 510 includes multiple signal outputs (e.g., 512a and 512b) corresponding to each mode of operation of the power amplifier 400. For example, the first signal output 512a may correspond to the first mode of operation, i.e., Bluetooth, and the controller 310 may control the multiplexer stage 510 to provide the linear output voltage to the first signal output 512a during the first mode of operation. Likewise, the second signal output 512b may correspond to the second mode of operation, i.e., WiFi, and the controller 310 may control the multiplexer stage 510 to provide the linear output voltage to the second signal output 512b during the second mode of operation. In some examples, the controller 310 may have first and second inputs configured to receive the linear output voltage from the first and second signal outputs 512a and 512b of the multiplexer stage 510. In another embodiment, the multiplexer stage 510 may not be included in the output detector 500 and the linear output voltage may be provided to a single input of the controller 310.

The linear output voltage (i.e., the detector output voltage) provided to the controller 310 is proportional to the output power of the amplifier assembly 400 (e.g., 200 mV=10 dB, 250 mV=11 dB, 300 mV=12 dB, etc.). The proportion of the detector output voltage to output power may vary based on the location of the output detector 500 in the power amplifier 400. For example, the proportion may vary based on where the signal provided to the signal input 502 of the output detector 500 is sampled from the plurality of amplifier stages 308 (e.g., before the last amplifier gain stage 308x, after the last amplifier gain stage 308x, etc.). In some examples, the controller 310 may use the sample location of the signal provided to the output detector 500 in combination with known properties of the plurality of amplifier gain stages 308 to determine the proportion of the detector output voltage to output power.

In one embodiment, as discussed above, mode specific settings for the output detector 500 may be included in the configuration parameters stored in the plurality of memory locations of the controller 310, and the controller 310 may control or operate the output detector 500 accordingly. In another embodiment, the controller 310 may provide a signal or command to the output detector 500 indicating the mode of operation of the power amplifier 400 and the mode specific settings may be implemented automatically within the output detector 500.

Embodiments of the power amplifier 400 as described herein can be implemented in a variety of different modules including, for example, a stand-alone amplifier module, a front-end module, a module combining the power amplifier 400 with an antenna switching network, or the like.

Modules may include a substrate and may include various dies and may include packaging, such as, for example, an overmold to provide protection and facilitate easier handling. An overmold may be formed over a substrate and dimensioned to substantially encapsulate the various dies and components thereon. The module may further include connectivity from the power amplifier 400 to the exterior of the packaging to provide signal interconnections, such as an input port connection, output port connection, control input connection (e.g., mode select signal 314), etc. Certain examples may have multiple connections to accommodate access to various individual components in the module. The various connections may be provided in part by wire bonds or solder bumps, for example, and may include multiple electrical connections where appropriate.

Embodiments of the power amplifiers disclosed herein, optionally packaged into a module, may be advantageously used in a variety of electronic devices. General examples of an electronic device may include a circuit board having numerous modules mounted thereon. The circuit board may have multiple layers and may include circuit elements and interconnections in the layers and/or mounted on the surface of the circuit board. Each of the modules may have a multi-layer substrate within and upon which there may also be various circuit elements and interconnections. Additionally, the modules may further include dies, each of which may have multiple layers and include various circuit elements and interconnections. A power amplifier in accord with aspects and embodiments disclosed herein may be implemented within, among, or across any of the layers of the various structures, e.g., circuit board, substrates, and dies, as part of an electronic device, such as a cell phone, tablet, laptop computer, smart device, router, cable modem, wireless access point, etc.

Figure 6:
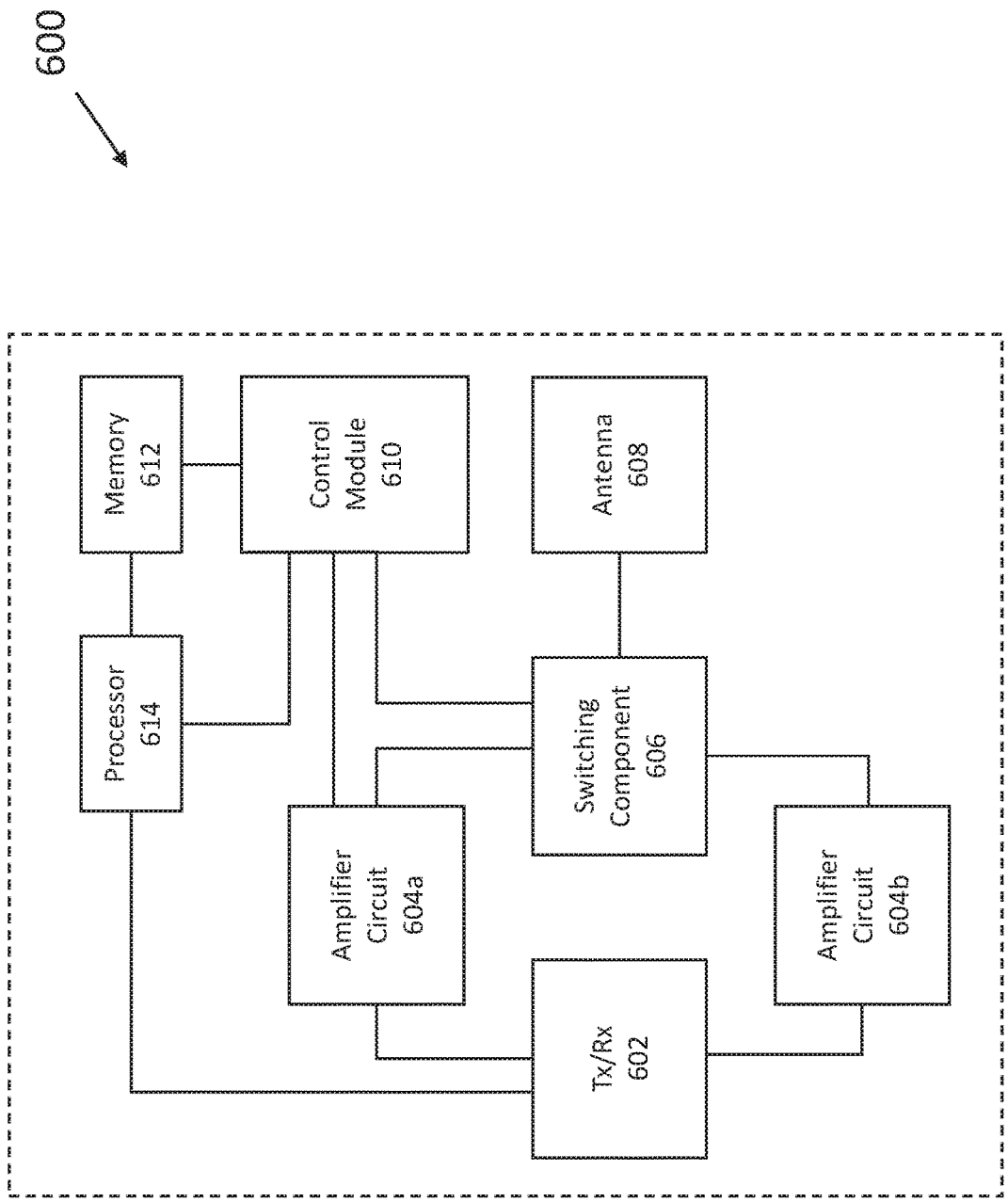
FIG. 6 is a block diagram of a wireless communication device in accordance with one embodiment.

For example, FIG. 6 is block diagram of a wireless communications device 600. The wireless device 600 can be a mobile device, such as a cellular telephone, a smart phone, a laptop computer, a tablet, etc. By way of example, the wireless device 600 can communicate in accordance with multiple communication standards including Bluetooth and WiFi. In this example, the wireless device 600 can be configured to operate at one or more frequency bands defined by the Bluetooth and WiFi standards. The wireless device 600 can alternatively or additionally be configured to communicate in accordance with one or more other communication standards, including but not limited to one or more of a 3G standard, a 4G standard, or a Long Term Evolution (LTE) standard.

As illustrated in FIG. 6, the wireless device 600 can include a transceiver 602, an amplifier circuit 604, a switching component 606, at least one antenna 608, a control component 610, a memory component 612, and at least one processor 614. The amplifier circuit 604a is configured to provide amplification of a radio-frequency signal to be transmitted via the at least one antenna 608, and the amplifier circuit 604b is configured to provide amplification of a radio-frequency signal received via the at least one antenna 608. In one example, the antenna circuit 604a may be the power amplifier 400. In other examples, the antenna circuit 604a may include the power amplifier 400 along with other circuitry, such as impedance matching networks.

In one example, the control component 610 may provide the functionality of the controller 310 described above and the configuration parameters for each mode of operation of the power amplifier 400 may be stored in the memory component 612. In another example, the controller 310 may be a separate controller within the power amplifier 400. In some examples, the configuration parameters may be stored in a plurality of memory locations of the controller 310; however, in other examples, the configuration parameters may be stored in the memory component 612 and provided to the controller 310 via the control component 610.

As described above, systems and methods directed to a multi-mode power amplifier that accommodates two or more signal types are provided herein. In at least one embodiment, the multi-mode power amplifier may accommodate two or more signal types by operating in two or more modes to meet various performance requirements of each signal type. More specifically, the configuration of the multi-mode power amplifier is optimized for a specific signal type during each mode of operation.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A power amplifier module comprising:
a power amplifier including a plurality of amplifier gain stages, the plurality of amplifier gain stages including an input amplifier gain stage having an input configured to receive an input radio frequency signal and an output amplifier gain stage having an output configured to provide an output radio frequency signal;
a memory device including a plurality of memory locations, the plurality of memory locations including at least one first memory location to store a first set of configuration parameters for operation of the power amplifier module in a first mode of operation, and at least one second memory location to store a second set of configuration parameters for operation of the power amplifier module in a second mode of operation, the second set of configuration parameters being different, at least in part, from the first set of configuration parameters; and
a controller to receive a control signal having at least one of a first state and a second state, the controller configuring the power amplifier module for operation in the first mode of operation based on the first set of configuration parameters responsive to receiving the control signal having the first state and configuring the power amplifier module for operation in the second mode of operation based on the second set of configuration parameters responsive to receiving the control signal having the second state.

2. The power amplifier module of claim 1 wherein the first set of configuration parameters includes a first set of bias levels for the plurality of amplifier gain stages and the second set of configuration parameters includes a second set of bias levels for the plurality of amplifier gain stages, the second set of bias levels being different, at least in part, from the first set of bias levels.

3. The power amplifier module of claim 2 wherein the controller is further configured to control a bias level of each respective amplifier gain stage of the plurality of amplifier gain stages based on the first set of bias levels in the first mode of operation and to control the bias level of each respective amplifier gain stage of the plurality of amplifier gain stages based on the second set of bias levels in the second mode of operation.

4. The power amplifier module of claim 3 wherein the power amplifier further includes an attenuator coupled between an input of the power amplifier and the input of the input amplifier gain stage, and a bypass path coupled in parallel with the attenuator.

5. The power amplifier module of claim 4 wherein the first set of configuration parameters includes a first bypass switch state and the second set of configuration parameters includes a second bypass switch state, the second bypass switch state being different than the first bypass switch state.

6. The power amplifier module of claim 5 wherein the controller is further configured to open the bypass switch based on the first bypass switch state in the first mode of operation and to close the bypass switch based on the second bypass switch state in the second mode of operation.

7. The power amplifier module of claim 1 wherein the power amplifier further includes an output detector coupled between the input amplifier gain stage and the output amplifier gain stage, the output detector configured to provide a linear output voltage to the controller indicating a power level of the output radio frequency signal.

8. The power amplifier module of claim 7 wherein the first set of configuration parameters includes a first output power level and the second set of configuration parameters includes a second output power level, the second output power level being different than the first output power level.

9. The power amplifier module of claim 8 wherein the controller is further configured to tune the power level of the output radio frequency signal based on the linear output voltage and the first output power level in the first mode of operation and based on the linear output voltage and the second output power level in the second mode of operation.

10. The power amplifier module of claim 9 wherein the controller is configured to tune the power level of the output radio frequency signal by adjusting the bias level of at least one amplifier gain stage of the plurality of amplifier gain stages.

11. The power amplifier module of claim 7 wherein the first set of configuration parameters includes a first set of output detector settings and the second set of configuration parameters includes a second set of output detector settings, the second set of output detector settings being different, at least in part, from the first set of output detector settings.

12. The power amplifier module of claim 11 wherein the controller is further configured to adjust the output detector to support a first signal bandwidth based on the first output detector settings in the first mode of operation and to adjust the output detector to support a second signal bandwidth based on the second set of output detector settings in the second mode of operation, the second signal bandwidth being different from the first signal bandwidth.

13. The power amplifier module of claim 11 wherein the controller is further configured to adjust the output detector to support a first output power slope of the power amplifier based on the first output detector settings in the first mode of operation and to adjust the output detector to support a second output power slope of the power amplifier based on the second set of output detector settings in the second mode of operation, the second output power slope being different than the first output power slope.

14. The power amplifier module of claim 11 wherein the controller is further configured to control the output detector to use a first offset value based on the first set of output detector settings in the first mode of operation and to control the output detector to use a second offset value based on the second set of output detector settings in the second mode of operation, the first offset value corresponding to a first absolute voltage level for the output radio frequency signal and the second offset value corresponding to a second absolute voltage level for the output radio frequency signal, the second offset value being different than the first offset value.

* * * * *